United States Patent
Ryu et al.

(10) Patent No.: US 11,767,611 B2
(45) Date of Patent: Sep. 26, 2023

(54) METHODS FOR PRODUCING A MONOCRYSTALLINE INGOT BY HORIZONTAL MAGNETIC FIELD CZOCHRALSKI

(71) Applicant: GlobalWafers Co., Ltd., Hsinchu (TW)

(72) Inventors: JaeWoo Ryu, Chesterfield, MO (US); Carissima Marie Hudson, St. Charles, MO (US); JunHwan Ji, Cheonan-si (KR); WooJin Yoon, Cheonan-Si (KR)

(73) Assignee: GlobalWafers Co., Ltd., Hsinchu (TW)

( * ) Notice: Subject to any disclaimer, the term of this patent is extended or adjusted under 35 U.S.C. 154(b) by 133 days.

(21) Appl. No.: 17/330,092

(22) Filed: May 25, 2021

(65) Prior Publication Data

US 2022/0025541 A1 Jan. 27, 2022

Related U.S. Application Data

(60) Provisional application No. 63/056,056, filed on Jul. 24, 2020.

(51) Int. Cl.
  *C30B 15/20* (2006.01)
  *C30B 15/10* (2006.01)
  *C30B 15/30* (2006.01)
  *C30B 29/06* (2006.01)

(52) U.S. Cl.
  CPC .............. *C30B 15/20* (2013.01); *C30B 15/10* (2013.01); *C30B 15/30* (2013.01); *C30B 29/06* (2013.01)

(58) Field of Classification Search
  CPC .......... C30B 15/20; C30B 15/10; C30B 15/30; C30B 29/06; Y10T 117/1032
  See application file for complete search history.

(56) References Cited

U.S. PATENT DOCUMENTS

| | | | |
|---|---|---|---|
| 6,869,477 B2 | 3/2005 | Haga et al. | |
| 8,114,214 B2 | 2/2012 | Constantz et al. | |
| 11,408,090 B2* | 8/2022 | Hudson | C30B 29/06 |
| 2003/0033972 A1 | 2/2003 | Javidi | |
| 2009/0038357 A1 | 2/2009 | Choi | |
| 2009/0169460 A1* | 7/2009 | Song | C30B 15/305 |
| | | | 423/349 |
| 2012/0132131 A1 | 5/2012 | Song et al. | |
| 2012/0141808 A1* | 6/2012 | Song | C30B 35/00 |
| | | | 428/446 |

(Continued)

FOREIGN PATENT DOCUMENTS

| | | |
|---|---|---|
| DE | 112010002568 B4 | 1/2017 |
| JP | H11209197 A | 8/1999 |
| KR | 20140094830 A | 7/2014 |

OTHER PUBLICATIONS

U.S. Appl. No. 17/115,154, filed Dec. 8, 2020, depending from U.S. Appl. No. 62/947,785, filed Dec. 13, 2019.

(Continued)

*Primary Examiner* — Robert M Kunemund
(74) *Attorney, Agent, or Firm* — Armstrong Teasdale LLP

(57) ABSTRACT

Methods for producing monocrystalline silicon ingots by horizontal magnetic field Czochralski are disclosed. During growth of the neck and/or growth of at least a portion of the crown, a magnetic field is not applied to the neck and/or crown or a relatively weak magnetic field of 1500 gauss or less is applied. A horizontal magnetic field (e.g., greater than 1500 gauss) is applied during growth of the ingot main body.

17 Claims, 8 Drawing Sheets

(56) References Cited

U.S. PATENT DOCUMENTS

2012/0279438 A1  11/2012  Ryu et al.
2015/0275392 A1  10/2015  Soeta et al.
2020/0002838 A1   1/2020  Lu et al.

OTHER PUBLICATIONS

International Search Report for International Application No. PCT/US2021/042908, 5 pages, dated Oct. 22, 2021.

* cited by examiner

US 11,767,611 B2

METHODS FOR PRODUCING A MONOCRYSTALLINE INGOT BY HORIZONTAL MAGNETIC FIELD CZOCHRALSKI

CROSS-REFERENCE TO RELATED APPLICATIONS

This patent application claims the benefit of U.S. Provisional Patent Application No. 63/056,056, filed Jul. 24, 2020, which is incorporated herein by reference in its entirety.

FIELD OF THE DISCLOSURE

This disclosure generally relates to the production of monocrystalline silicon ingots by horizontal magnetic field Czochralski.

BACKGROUND

Horizontal magnetic field Czochralski (HMCZ) methods may be used to produce relatively high quality silicon wafers. Strong convection control under horizontal magnetic field Czochralski enables a relatively smooth axial diameter profile as well as improves the nanotopology due to low dopant striation. The magnetic field may change the condition of the ingot-melt interface due to relatively high velocity and complexity of the melt flow. To ensure the crystal grows with high zero dislocation (ZD) success, the ingot crown is grown under controlled conditions with application of the horizontal magnetic field. Controlled growth conditions include longer process times to allow the crown height to be longer (e.g., 250 mm to 450 mm for 300 mm crystals) and in some instances special crown shapes are used. Neck growth is conventionally performed under horizontal magnetic field to stabilize the melt temperature near the meniscus. Conventional horizontal magnetic field methods result in longer process times.

A need exists for methods for producing a monocrystalline silicon ingot by the horizontal magnetic field Czochralski (HMCz) method which may decrease process time for forming the ingot.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for producing a monocrystalline silicon ingot having a neck and a main body suspended from the neck by the horizontal magnetic field Czochralski method. A seed crystal is contacted with a silicon melt held within a crucible. A neck is pulled from the silicon melt. A horizontal magnetic field is not applied to the melt while the neck is pulled from the melt. An ingot main body is pulled from the melt. The main body is suspended from the neck. A horizontal magnetic field is applied to the melt while the ingot main body is pulled from the melt.

Another aspect of the present disclosure is directed to a method for producing a monocrystalline silicon ingot having a neck and a main body suspended from the neck by the horizontal magnetic field Czochralski method. A seed crystal is contacted with a silicon melt held within a crucible. A neck is pulled from the silicon melt. A horizontal magnetic field is applied to the melt while the neck is pulled from the melt. The horizontal magnetic field is generated at a magnetic flux density of 1500 gauss or less. An ingot main body is pulled from the melt. The main body is suspended from the neck. A horizontal magnetic field is applied to the melt while the ingot main body is pulled from the melt.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
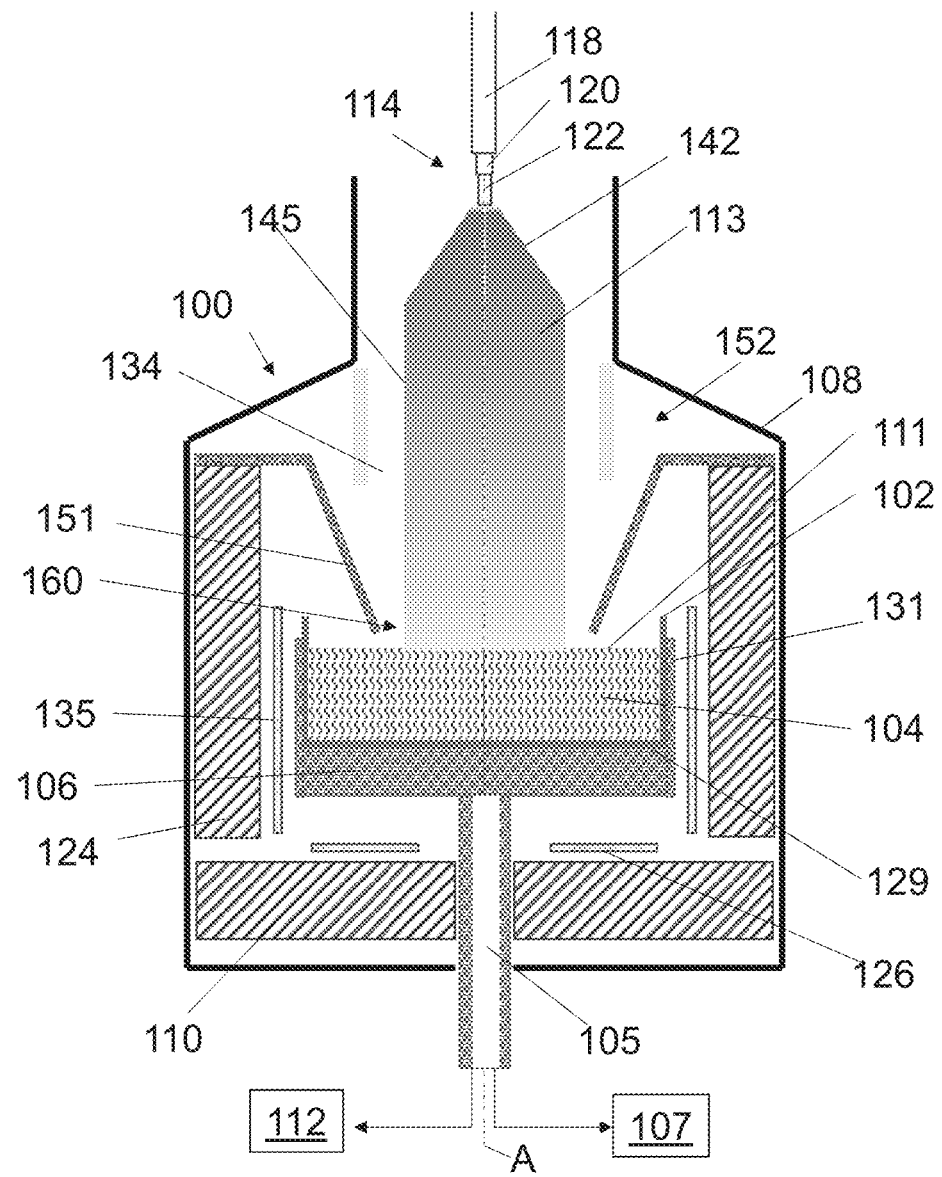
FIG. 1 is a cross-section view of an ingot puller apparatus used to pull a single crystal silicon ingot from a silicon melt.

Provisions of the present disclosure relate to methods for producing a monocrystalline silicon ingot by the horizontal magnetic field Czochralski method (HMCz). An ingot puller apparatus (or more simply "ingot puller") for growing a monocrystalline silicon ingot is indicated generally at "100" in FIG. 1. The ingot puller apparatus 100 includes a crystal puller housing 108 that defines a growth chamber 152 for pulling a silicon ingot 113 from a melt 104 of silicon. The ingot puller apparatus 100 includes a crucible 102 disposed within the growth chamber 152 for holding the melt 104 of silicon. The crucible 102 is supported by a susceptor 106.

The crucible 102 includes a floor 129 and a sidewall 131 that extends upward from the floor 129. The sidewall 131 is generally vertical. The floor 129 includes the curved portion of the crucible 102 that extends below the sidewall 131. Within the crucible 102 is a silicon melt 104 having a melt surface 111 (i.e., melt-ingot interface). The susceptor 106 is supported by a shaft 105. The susceptor 106, crucible 102, shaft 105 and ingot 113 have a common longitudinal axis A or "pull axis" A.

A pulling mechanism 114 is provided within the ingot puller apparatus 100 for growing and pulling an ingot 113 from the melt 104. Pulling mechanism 114 includes a pulling cable 118, a seed holder or chuck 120 coupled to one end of the pulling cable 118, and a seed crystal 122 coupled to the seed holder or chuck 120 for initiating crystal growth. One end of the pulling cable 118 is connected to a pulley (not shown) or a drum (not shown), or any other suitable type of lifting mechanism, for example, a shaft, and the other end is connected to the chuck 120 that holds the seed crystal 122. In operation, the seed crystal 122 is lowered to contact the melt 104. The pulling mechanism 114 is operated to cause the seed crystal 122 to rise. This causes a single crystal ingot 113 to be pulled from the melt 104.

During heating and crystal pulling, a crucible drive unit 107 (e.g., a motor) rotates the crucible 102 and susceptor 106. A lift mechanism 112 raises and lowers the crucible 102 along the pull axis A during the growth process. As the ingot grows, the silicon melt 104 is consumed and the height of the melt in the crucible 102 decreases. The crucible 102 and susceptor 106 may be raised to maintain the melt surface 111 at or near the same position relative to the ingot puller apparatus 100.

A crystal drive unit (not shown) may also rotate the pulling cable 118 and ingot 113 in a direction opposite the direction in which the crucible drive unit 107 rotates the crucible 102 (e.g., counter-rotation). In embodiments using iso-rotation, the crystal drive unit may rotate the pulling cable 118 in the same direction in which the crucible drive unit 107 rotates the crucible 102. In addition, the crystal drive unit raises and lowers the ingot 113 relative to the melt surface 111 as desired during the growth process.

The ingot puller apparatus 100 may include an inert gas system to introduce and withdraw an inert gas such as argon from the growth chamber 152. The ingot puller apparatus 100 may also include a dopant feed system (not shown) for introducing dopant into the melt 104.

According to the Czochralski single crystal growth process, a quantity of polycrystalline silicon, or polysilicon, is charged to the crucible 102 (e.g., charge of 250 kg or more). A variety of sources of polycrystalline silicon may be used including, for example, granular polycrystalline silicon produced by thermal decomposition of silane or a halosilane in a fluidized bed reactor or polycrystalline silicon produced in a Siemens reactor. Once polycrystalline silicon is added to the crucible to form a charge, the charge is heated to a temperature above about the melting temperature of silicon (e.g., about 1412° C.) to melt the charge. In some embodiments, the charge (i.e., the resulting melt) is heated to a temperature of at least about 1425° C., at least about 1450° C. or even at least about 1500° C. The ingot puller apparatus 100 includes bottom insulation 110 and side insulation 124 to retain heat in the puller apparatus 100. In the illustrated embodiment, the ingot puller apparatus 100 includes a bottom heater 126 disposed below the crucible floor 129. The crucible 102 may be moved to be in relatively close proximity to the bottom heater 126 to melt the polycrystalline silicon charged to the crucible 102.

To form the ingot, the seed crystal 122 is contacted with the surface 111 of the melt 104. The pulling mechanism 114 is operated to pull the seed crystal 122 from the melt 104. The ingot 113 includes a crown portion 142 in which the ingot transitions and tapers outward from the seed crystal 122 to reach a target diameter. The ingot 113 includes a constant diameter portion 145 or cylindrical "main body" of the crystal which is grown by increasing the pull rate. The main body 145 of the ingot 113 has a relatively constant diameter. The ingot 113 includes a tail or end-cone (not shown) in which the ingot tapers in diameter after the main body 145. When the diameter becomes small enough, the ingot 113 is then separated from the melt 104. The ingot 113 has a central longitudinal axis A that extends through the crown portion 142 and a terminal end of the ingot 113.

The ingot puller apparatus 100 includes a side heater 135 and a susceptor 106 that encircles the crucible 102 to maintain the temperature of the melt 104 during crystal growth. The side heater 135 is disposed radially outward to the crucible sidewall 131 as the crucible 102 travels up and down the pull axis A. The side heater 135 and bottom heater 126 may be any type of heater that allows the side heater 135 and bottom heater 126 to operate as described herein. In some embodiments, the heaters 135, 126 are resistance heaters. The side heater 135 and bottom heater 126 may be controlled by a control system (not shown) so that the temperature of the melt 104 is controlled throughout the pulling process.

In accordance with embodiments of the present disclosure, the ingot puller apparatus 100 also includes a reflector assembly 151 (or simply "reflector" or "heat shield") disposed within the growth chamber 152 and above the melt 104 which shrouds the ingot 113 during ingot growth. The heat shield 151 may be partially disposed within the crucible 102 during crystal growth. The heat shield 151 defines a central passage 160 for receiving the ingot 113 as the ingot is pulled by the pulling mechanism 114.

Figure 2:
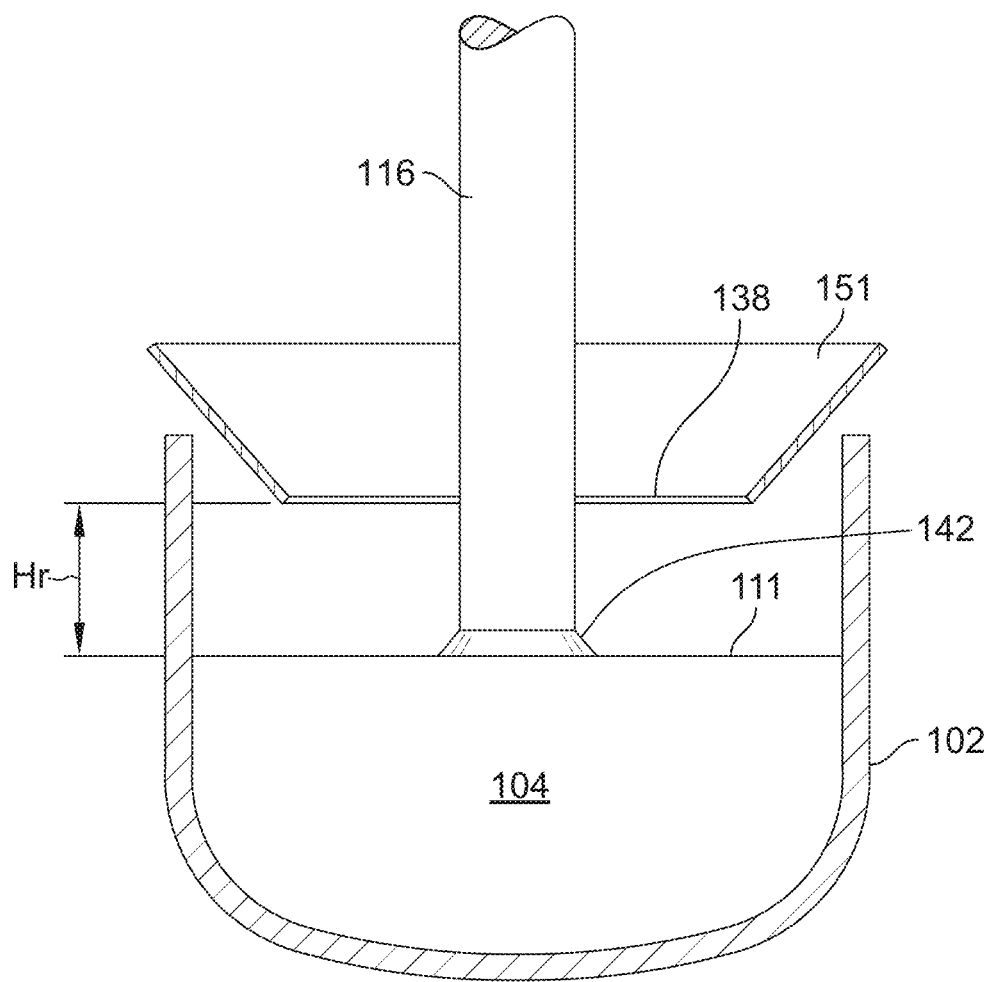
FIG. 2 is a cross-section of an ingot puller apparatus.

The reflector 151 is, in general, a heat shield adapted to retain heat underneath itself and above the melt 104. In this regard, any reflector design and material of construction (e.g., graphite or gray quartz) known in the art may be used without limitation. The reflector 151 has a bottom 138 (FIG. 2) and the bottom 138 of the reflector 151 is separated from the surface of the melt by a distance Hr during ingot growth.

Figure 3:
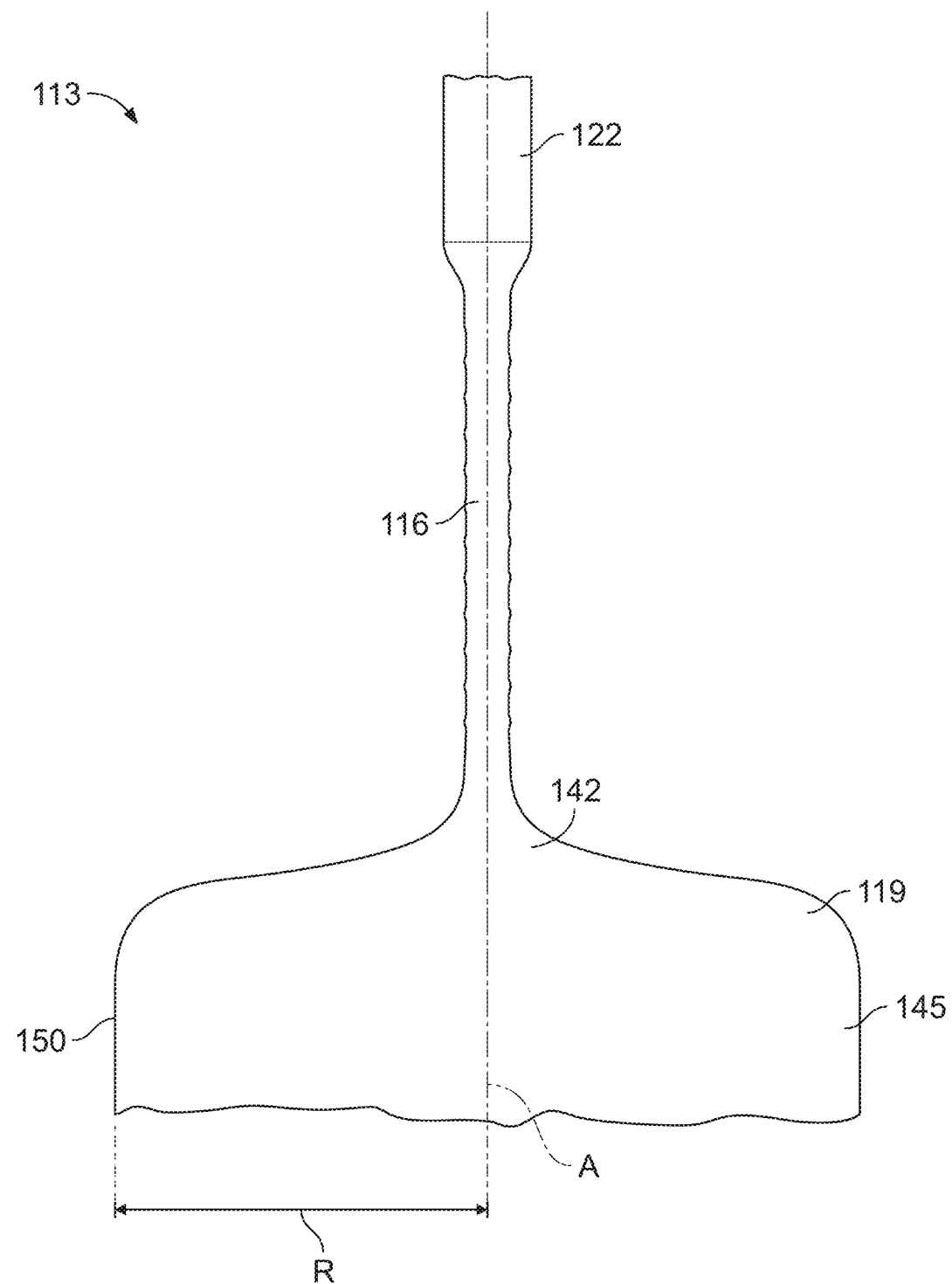
FIG. 3 is a partial front view of a single crystal silicon ingot grown by the Czochralski method.

A single crystal silicon ingot 113 produced in accordance with embodiments of the present disclosure and, generally, the Czochralski method is shown in FIG. 3. The ingot 113 includes a neck 116, an outwardly flaring portion 142 (synonymously "crown" or "cone"), a shoulder 119 and a constant diameter main body 145. The neck 116 is attached to the seed crystal 122 that was contacted with the melt and withdrawn to form the ingot 113. The main body 145 is suspended from the neck 116. The neck 116 terminates once the cone portion 142 of the ingot 113 begins to form.

The constant diameter portion 145 of the ingot 113 has a circumferential edge 150, a central axis A that is parallel to the circumferential edge 150 and a radius R that extends from the central axis A to the circumferential edge 150. The central axis A also passes through the cone 142 and neck 116. The diameter of the main ingot body 145 may vary and, in some embodiments, the diameter may be about 150 mm, about 200 mm, about 300 mm, greater than about 300 mm, about 450 mm or even greater than about 450 mm.

The single crystal silicon ingot 113 may generally have any resistivity. The single crystal silicon ingot 113 may be doped or undoped.

Figure 4:
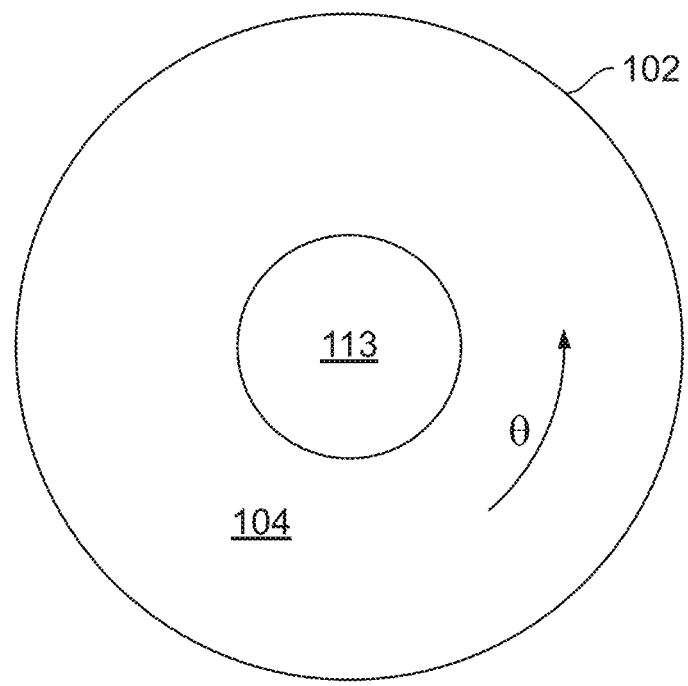
FIG. 4 is a top view of a crucible of the ingot puller apparatus.
Figure 5:
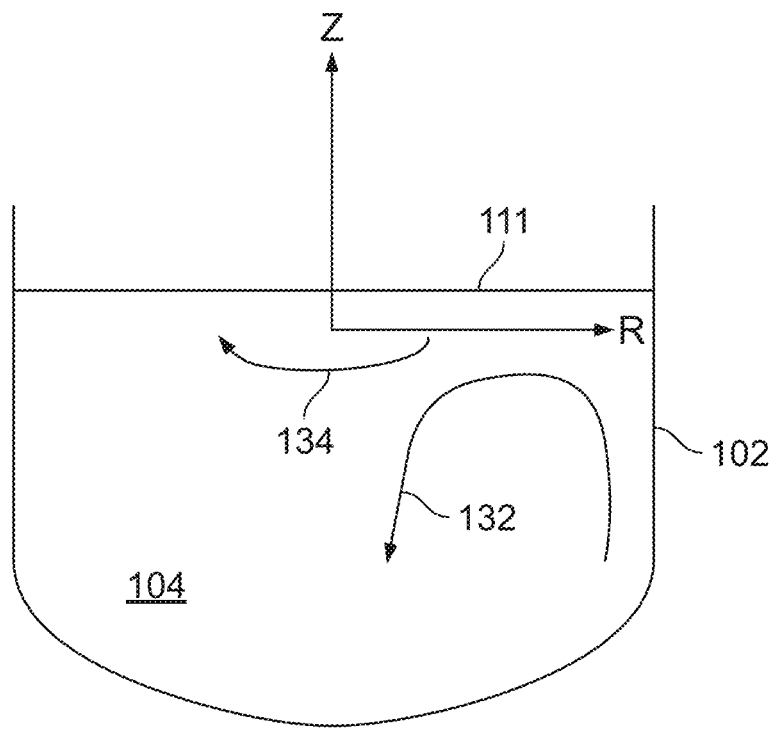
FIG. 5 is a side view of the crucible.

In accordance with embodiments of the present disclosure, the ingot main body 145 is grown while applying a horizontal magnetic field to the crucible 102 and melt 104 in accordance with known horizontal magnetic field Czochralski techniques (HMCz). FIGS. 4-5 show a horizontal magnetic field applied to a crucible 102 and melt 104 during ingot growth. A cylindrical coordinate system for the crucible 102 includes a radial direction R, an angular direction θ, and an axial direction Z. The melt 104 may contain one or more convective flow cells 132, 134 induced by heating of the crucible 102 and rotation of the crucible 102 and/or ingot 113 in the angular direction θ. The structure and interaction of these one or more convective flow cells 132, 134 may be modulated via regulation of one or more process parameters and/or the application of a horizontal magnetic field as described in detail herein below.

Figure 6:
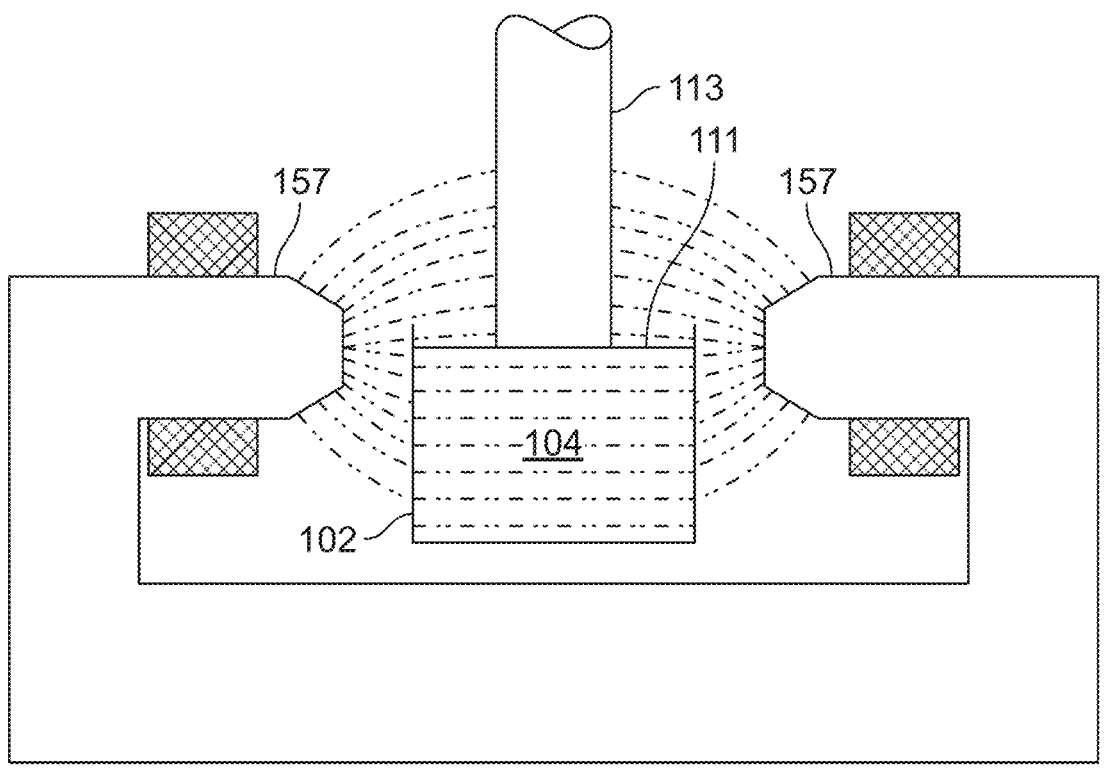
FIG. 6 is a schematic illustrating a horizontal magnetic field applied to the crucible containing a melt.

FIG. 6 is a diagram illustrating a horizontal magnetic field applied to the crucible 102 and melt 104 in the ingot puller apparatus 100. As shown, the crucible 102 contains the silicon melt 104 from which the ingot 113 is grown. The transition between the melt and the crystal is generally referred to as the crystal-melt interface (alternatively the melt-crystal, solid-melt or melt-solid interface) and is typically non-linear, for example concave, convex or gull-winged relative to the melt surface. Two magnetic poles 157 are placed in opposition to generate a magnetic field generally perpendicular to the crystal-growth direction and generally parallel to the melt surface 111.

The magnetic poles 157 may be a conventional electromagnet, a superconductor electromagnet, or any other suitable magnet for producing a horizontal magnetic field of the desired strength. Application of a horizontal magnetic field gives rise to Lorentz force along the axial direction, in a direction opposite of fluid motion, with opposing forces driving melt convection. The convection in the melt is thus suppressed, and the axial temperature gradient in the crystal near the interface increases. The melt-crystal interface then moves upward to the crystal side to accommodate the increased axial temperature gradient in the crystal near the interface and the contribution from the melt convection in the crucible decreases. The horizontal configuration has the advantage of efficiency in damping a convective flow at the melt surface 111.

The position of the magnetic poles 157 relative to the melt surface 111 may be varied to adjust the position of the maximum gauss plane (MGP) relative to the melt surface 111. The magnetic poles 157 may be cooled (e.g., water cooled) and/or may include a ferrous shield to reduce stray magnetic fields and to enhance the strength of the field produced.

The loss of zero dislocation (ZD) structure (quantified by LZD rate) is generally higher during silicon crystal Cz growth in a horizontal magnetic (HMCZ) field versus growth in a Cusp (or vertical) magnetic field. However, the LZD rate in HMCZ can be lowered with shorter process time by not applying a magnetic field (e.g., a horizontal magnetic field or any type of magnetic field) during neck 116 growth and/or at least a portion of crown 142 growth or by applying a relatively weak horizontal magnetic field (e.g., less than 1500 gauss) during neck 116 growth and/or at least a portion of crown 142 growth.

In accordance with embodiments of the present disclosure, once the seed crystal 122 contacts the silicon melt 104 and the neck 116 begins grown, a magnetic field is not applied to the melt 104 (i.e., the magnetic poles 157 are not powered) or a relatively weak magnetic field such as 1500 gauss or less is applied. Once the neck 116 is formed, the outwardly flaring crown 142 begins to be pulled from the melt 104. In some embodiments, the entire crown 142 is formed without a magnetic field being applied to the melt or a relatively weak magnetic field such as 1500 gauss or less is applied. In some embodiments, when the crown diameter is less than 120 mm, a magnetic field is not applied to the melt or a magnetic field is applied with the magnetic flux density being less than 1500 gauss. In such embodiments, once a diameter of 120 mm is reached in the crown 142, the magnetic flux density of the horizontal magnetic field may exceed 1500 gauss (e.g., 0 gauss to 4000 gauss). In some embodiments, the magnetic field flux is ramped up (i.e., increase) during crown growth.

Once the desired ingot diameter is reached, the shoulder 119 is formed to transition toward forming the constant diameter portion 145 of the ingot 113. A horizontal magnetic field is applied to the melt 104 during growth of the constant diameter portion 145. For example, a horizontal magnetic field having a magnetic flux density of at least 1500 gauss (e.g., 1500 gauss to 4000 gauss or 2000 gauss to 4000 gauss).

To reduce the incidence of dislocations in the neck 116 during neck growth, one or more growth conditions may be controlled. For example, in some embodiments, the crucible 102 is rotated at a crucible rotation rate of 8 rpm or more while pulling the neck 116 from the melt 104. Alternatively or in addition, the distance (Hr) between the bottom 138 of the reflector 151 and the surface 111 of the melt 104 may be at least 40 mm or even at least 60 mm while pulling the neck 116 from the melt 104. Alternatively or in addition, the pull rate of the neck may be at least 1.5 mm/min or from 1.5 mm/min to 4.5 mm/min. Alternatively or in addition, a relatively long crown may be used such as a crown having a height of at least 220 mm.

Compared with conventional methods for growing a monocrystalline ingot by the horizontal magnetic Czochralski method, methods of the present disclosure have several advantages. By not applying the horizontal magnetic field during neck growth and/or at least a portion of crown growth or applying a relatively weak field (e.g., less than 1500 gauss), the process time to produce the ingot may be reduced. By increasing the crucible rotation rate (e.g., 8 rpm or more), the convective flow of the melt may be increased. By increasing the distance (Hr) between the reflector and the melt during neck growth (e.g., 40 mm or more), the neck temperature increases which reduces dislocations in the neck and process time may be reduced.

EXAMPLES

The processes of the present disclosure are further illustrated by the following Examples. These Examples should not be viewed in a limiting sense.

Example 1: Comparison of Crown Process Time with Horizontal Magnetic Field being Applied and not Applied Ingots were grown by the horizontal magnetic field Czochralski process (HMCz). A set of ingots were grown with a horizontal magnetic field being applied during crown growth ("Group A"). A second set of ingots were also grown with a horizontal magnetic field being applied during crown growth but at a faster pull speed ("Group B"). A third set of ingots were grown without a magnetic field being applied during crown growth (but applied during growth of the main body of the ingot) ("Group C").

Figure 7:
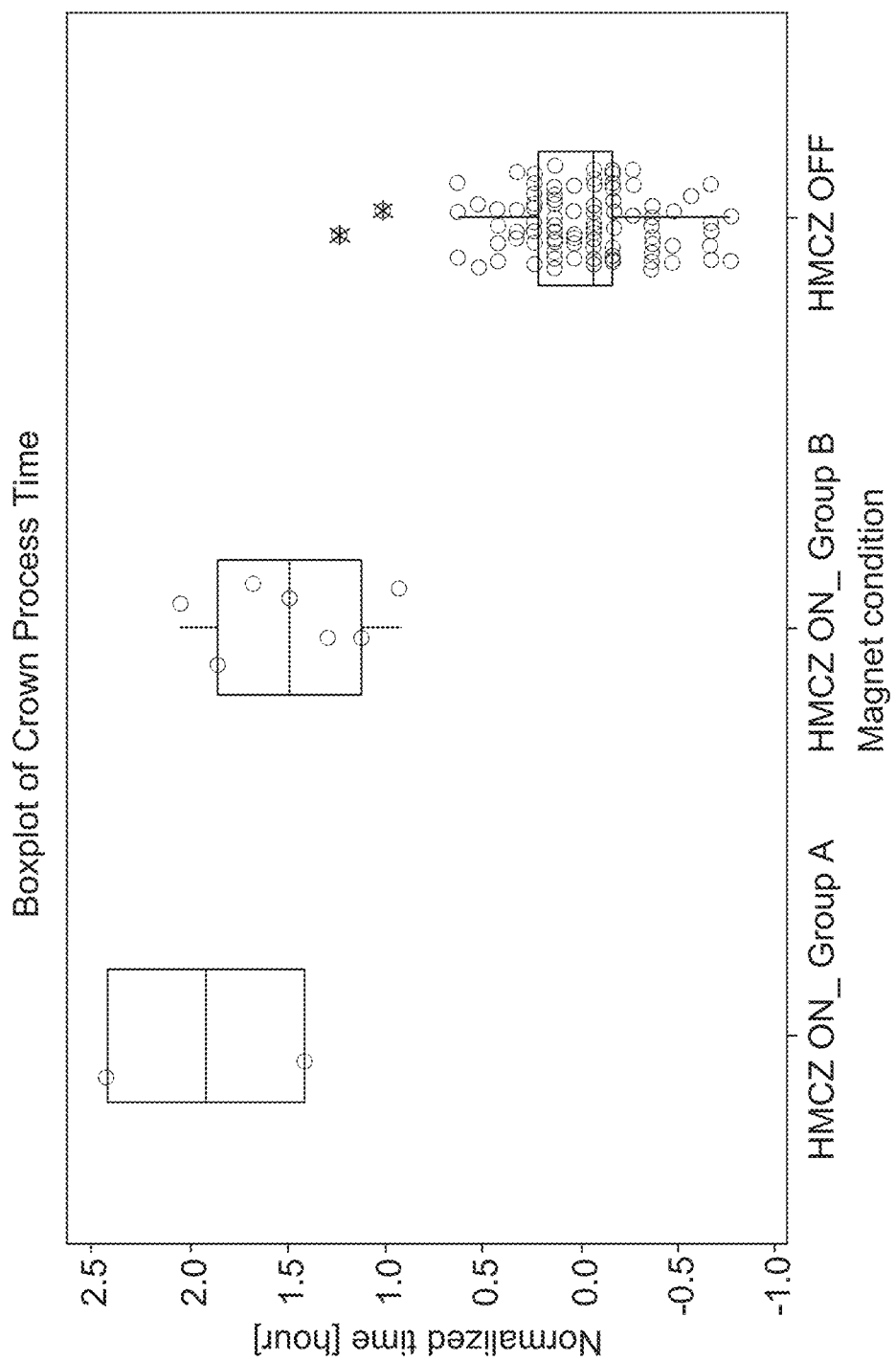
FIG. 7 is a graph showing crown time for groups of wafers grown while applying a horizontal magnetic field to the crown and while not applying a magnetic field to the crown.

The time to grow the crown for each set of ingots is shown in FIG. 7. As shown in FIG. 7, the ingots in which a horizontal magnetic field was applied during crown growth took 1.5 times as long to grow than the ingot in which a horizontal magnetic field was not applied during crown growth. The longer run time may be attributed to the larger crown height in ingots in which a horizontal magnetic field was applied during crown growth.

Example 2: Pull Rates for Zero Dislocation Ingot Growth

Figure 8:
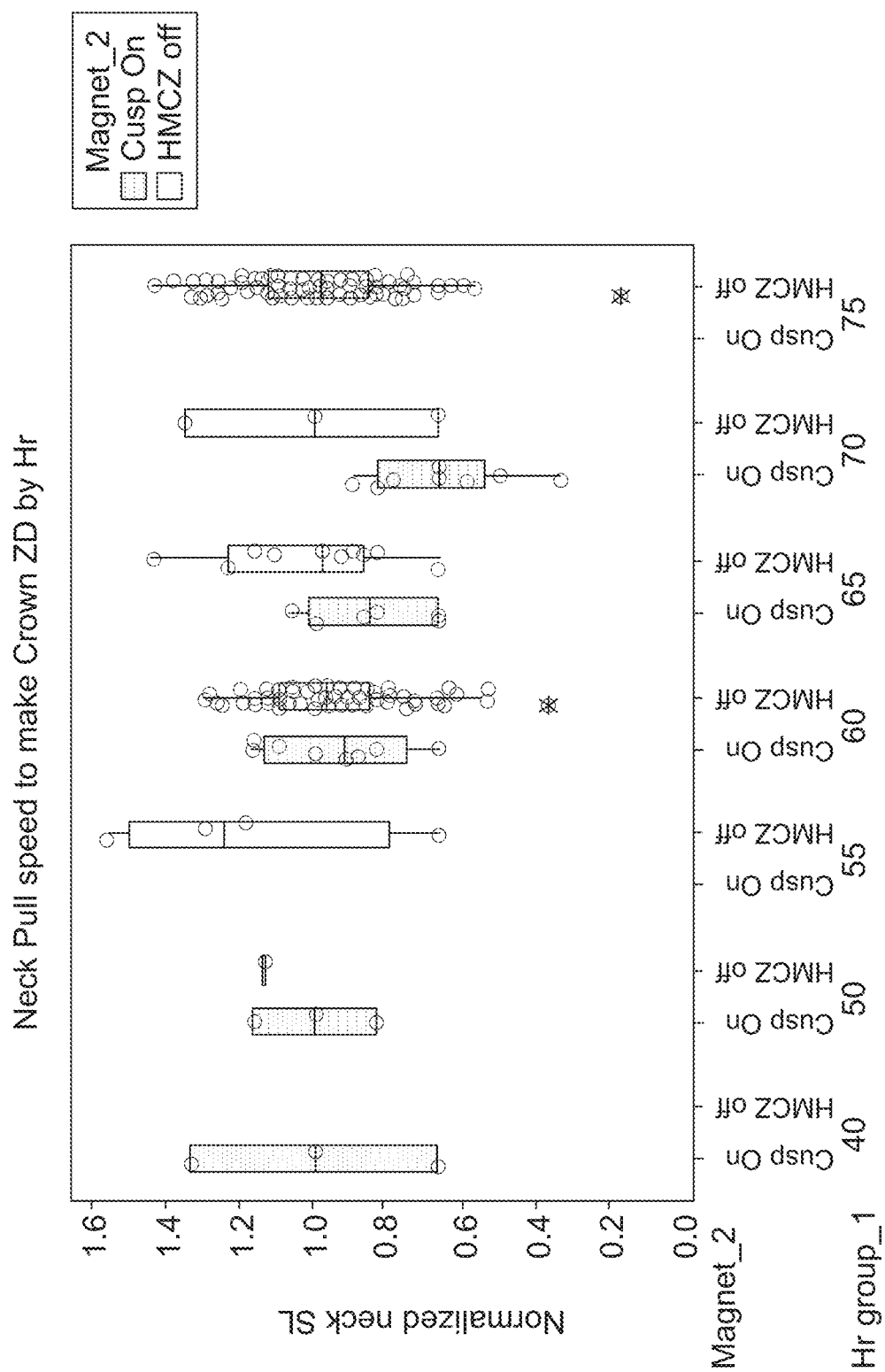
FIG. 8 is a graph showing neck pull speed for zero dislocation neck growth for a variety of reflector heights for necks grown with a cusp magnetic field and with no magnetic field being applied during neck growth.

FIG. 8 shows the range of neck pull speeds in which zero dislocation was achieved for a variety of reflector distances ("Hr group_1") and a variety of magnet conditions during neck growth (cusp field being applied during neck growth ("Cusp On") or no magnetic field being applied during neck growth ("HMCZ off")). As shown in FIG. 8, in the conditions in which the horizontal magnetic field was not applied, faster neck pull rates were used to ensure zero-dislocation growth.

Example 3: Impact of Reflector Distance on Zero Dislocation Rate

Figure 9:
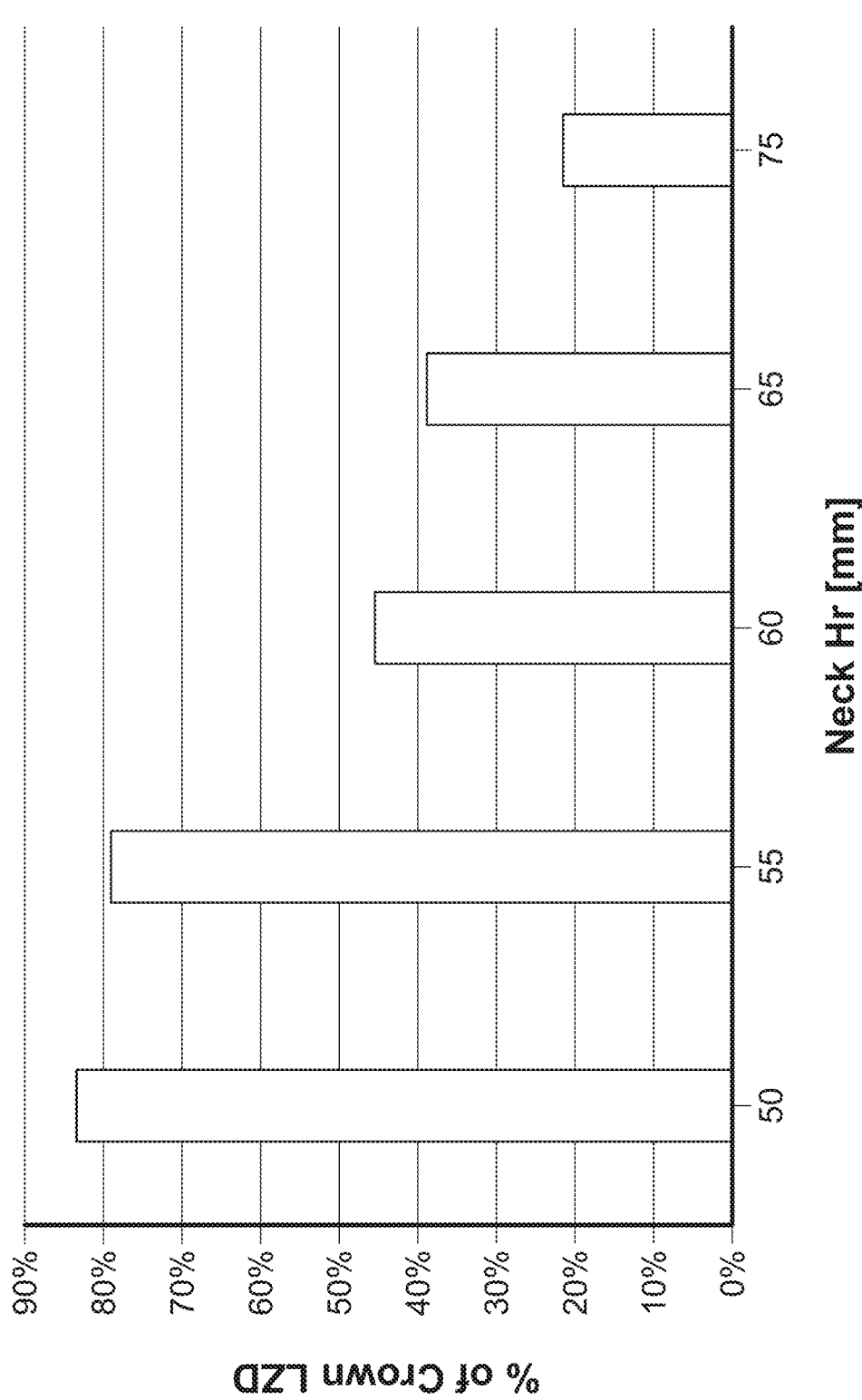
FIG. 9 is a graph showing the crown zero-dislocation loss failure rate for a variety of reflector heights during HMCz with a magnetic field not being applied during neck growth.

Ingots were grown by HMCz with a magnetic field not being applied during neck growth. The ingots were grown over a variety of reflector-melt distances ("Neck Hr"). As shown in FIG. 9, as Hr becomes more shallow, the melt flow nearby the neck-melt interface is less able to remove dislocations. The hotter conditions with wide Hr enhances the movement of dislocations in the neck.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a," "an," "the," and "said" are intended to mean that there are one or more of the elements. The terms "comprising," "including," "containing," and "having" are intended to be inclusive and mean that there may be additional elements other than the listed elements. The use of terms indicating a particular orientation (e.g., "top," "bottom," "side," etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A method for producing a monocrystalline silicon ingot having a neck and a main body suspended from the neck by the horizontal magnetic field Czochralski method, the monocrystalline silicon ingot being grown in an ingot puller apparatus having a heat shield, the method comprising:
   contacting a seed crystal with a silicon melt held within a crucible;
   pulling a neck from the silicon melt, wherein:
      a horizontal magnetic field is not applied to the melt while the neck is pulled from the melt;
      the crucible is rotated at a crucible rotation rate of 8 rpm or more while pulling the neck from the melt; and
      a distance between the melt and a bottom of the heat shield is at least 60 mm while pulling the neck from the melt; and
   pulling an ingot main body from the melt, the main body being suspended from the neck, wherein a horizontal magnetic field is applied to the melt while the ingot main body is pulled from the melt.

2. The method as set forth in claim 1 comprising pulling an outwardly flaring portion of the ingot, the outwardly flaring portion being disposed between the neck and the ingot main body, wherein a horizontal magnetic field is not applied to the melt while pulling the outwardly flaring portion from the melt.

3. The method as set forth in claim 2 wherein a magnetic field is not applied to the melt while pulling the outwardly flaring portion.

4. The method as set forth in claim 1 wherein a magnetic field is not applied to the melt while pulling the neck from the melt.

5. The method as set forth in claim 1 comprising pulling an outwardly flaring portion of the ingot, the outwardly flaring portion being disposed between the neck and the ingot main body, wherein a horizontal magnetic field is not applied to the melt while pulling at least a portion of the outwardly flaring portion from the melt, wherein the distance between the melt and the bottom of the heat shield is at least 40 mm while pulling the outwardly flaring portion from the melt.

6. The method as set forth in claim 1 comprising pulling an outwardly flaring portion of the ingot, the outwardly flaring portion being disposed between the neck and the ingot main body, wherein a horizontal magnetic field is not applied to the melt while pulling at least a portion of the outwardly flaring portion from the melt, wherein the distance between the melt and the bottom of the heat shield is at least 60 mm while pulling the outwardly flaring portion from the melt.

7. The method as set forth in claim 1 wherein the neck is grown at a pull rate of at least 1.5 mm/min and less than 4.5 mm/min.

8. The method as set forth in claim 1 comprising pulling an outwardly flaring portion of the ingot, the outwardly flaring portion being disposed between the neck and the ingot main body, the outwardly flaring portion having a height that is at least 220 mm.

9. A method for producing a monocrystalline silicon ingot having a neck and a main body suspended from the neck by the horizontal magnetic field Czochralski method, the monocrystalline silicon ingot being grown in an ingot puller apparatus having a heat shield, the method comprising:
   contacting a seed crystal with a silicon melt held within a crucible;
   pulling a neck from the silicon melt, wherein:
      a horizontal magnetic field is applied to the melt while the neck is pulled from the melt, the horizontal magnetic field being generated at a magnetic flux density of 1500 gauss or less;
      the crucible is rotated at a crucible rotation rate of 8 rpm or more while pulling the neck from the melt; and
      a distance between the melt and a bottom of the heat shield is at least 60 mm while pulling the neck from the melt; and
   pulling an ingot main body from the melt, the main body being suspended from the neck, wherein a horizontal magnetic field is applied to the melt while the ingot main body is pulled from the melt.

10. The method as set forth in claim 9 comprising pulling an outwardly flaring portion of the ingot, the outwardly flaring portion being disposed between the neck and the ingot main body, wherein a horizontal magnetic field is not applied to the melt while pulling a portion of the outwardly flaring portion.

11. The method as set forth in claim 9 comprising pulling an outwardly flaring portion of the ingot, the outwardly flaring portion being disposed between the neck and the ingot main body, wherein a horizontal magnetic field is applied to the melt while pulling a portion of the outwardly flaring portion.

12. The method as set forth in claim 11 wherein the horizontal magnetic field is between 0 gauss to 1500 gauss at an outwardly flaring portion diameter of less than 120 mm.

13. The method as set forth in claim 12 wherein the horizontal magnetic field is increased during growth of a portion of the outwardly flaring portion.

14. The method as set forth in claim 9 wherein the neck is grown at a pull rate of at least 1.5 mm/min and less than 4.5 mm/min.

15. The method as set forth in claim 9 comprising pulling an outwardly flaring portion of the ingot, the outwardly flaring portion being disposed between the neck and the ingot main body, the outwardly flaring portion having a height that is at least 220 mm.

16. The method as set forth in claim 1 wherein the ingot main body has a diameter of 300 mm.

17. The method as set forth in claim 9 wherein the ingot main body has a diameter of 300 mm.

* * * * *